US012765235B2

United States Patent

Kim et al.

(12) United States Patent
(10) Patent No.: US 12,765,235 B2
(45) Date of Patent: Oct. 13, 2026

(54) DISPLAY APPARATUS

(71) Applicant: Samsung Display Co., Ltd., Yongin-si (KR)

(72) Inventors: Hyunho Kim, Yongin-si (KR); Hyeonbum Lee, Yongin-si (KR); Donguk Kim, Yongin-si (KR); Hyoengki Kim, Yongin-si (KR); Hoongi Lee, Yongin-si (KR); Chaungi Choi, Yongin-si (KR); Jongbeom Hong, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 359 days.

(21) Appl. No.: 18/485,123

(22) Filed: Oct. 11, 2023

(65) Prior Publication Data

US 2024/0172532 A1 May 23, 2024

(30) Foreign Application Priority Data

Nov. 23, 2022 (KR) ........................ 10-2022-0158528

(51) Int. Cl.

*H10K 59/80* (2023.01)
*H10K 59/122* (2023.01)
*H10K 59/126* (2023.01)
*H10K 102/00* (2023.01)

(52) U.S. Cl.

CPC ......... *H10K 59/873* (2023.02); *H10K 59/122* (2023.02); *H10K 59/126* (2023.02); *H10K 59/8792* (2023.02); *H10K 2102/351* (2023.02)

(58) Field of Classification Search

CPC . H10K 59/126; H10K 59/8792; H10K 59/873
USPC .................................................. 313/498–512
See application file for complete search history.

(56) References Cited

U.S. PATENT DOCUMENTS

| | | | | |
|---|---|---|---|---|
| 10,553,622 | B2 | 2/2020 | Lee et al. | |
| 2016/0124557 | A1 | 5/2016 | Choi | |
| 2019/0165074 | A1 | 5/2019 | Lee et al. | |
| 2019/0189728 | A1 | 6/2019 | Lee et al. | |
| 2021/0399262 | A1 | 12/2021 | Woo et al. | |
| 2022/0037620 | A1* | 2/2022 | Baek | H10W 90/00 |
| 2022/0059805 | A1* | 2/2022 | Cho | H10K 59/8731 |
| 2022/0190045 | A1* | 6/2022 | Lee | G06F 3/0412 |

(Continued)

FOREIGN PATENT DOCUMENTS

| | | | |
|---|---|---|---|
| KR | 10-2009-0065104 | A | 6/2009 |
| KR | 10-2016-0008728 | A | 1/2016 |

(Continued)

*Primary Examiner* — Christopher M Raabe

(74) *Attorney, Agent, or Firm* — Womble Bond Dickinson (US) LLP

(57) ABSTRACT

A display apparatus includes: a substrate; a display element on the substrate; a thin-film encapsulation layer on the display element and including a first inorganic encapsulation layer, a first organic encapsulation layer, and a second inorganic encapsulation layer; a first light-shielding layer between the first inorganic encapsulation layer and the first organic encapsulation layer and having a first opening corresponding to an emission area of the display element; and a second light-shielding layer over the thin-film encapsulation layer and having a second opening corresponding to the emission area of the display element.

20 Claims, 13 Drawing Sheets

(56) References Cited

U.S. PATENT DOCUMENTS

| | | | |
|---|---|---|---|
| 2022/0238848 | A1 | 7/2022 | Kwon et al. |
| 2022/0293890 | A1 | 9/2022 | Jeong et al. |

FOREIGN PATENT DOCUMENTS

| | | | |
|---|---|---|---|
| KR | 10-2019-0064701 | A | 6/2019 |
| KR | 10-2021-0157947 | A | 12/2021 |
| KR | 10-2022-0086771 | A | 6/2022 |
| KR | 10-2022-0108287 | A | 8/2022 |

* cited by examiner

DISPLAY APPARATUS

CROSS-REFERENCE TO RELATED APPLICATION

This application claims priority to and the benefit of Korean Patent Application No. 10-2022-0158528, filed on Nov. 23, 2022, in the Korean Intellectual Property Office, the entire disclosure of which is incorporated herein by reference.

BACKGROUND

1. Field

Aspects of embodiments relate to a display apparatus.

2. Description of the Related Art

Recently, display apparatuses have been widely used. Because the thickness and weight of display apparatuses have been reduced, the use of the display apparatuses has widened, and as the display apparatuses are utilized in various fields, the demand for display apparatuses providing high-quality images is increasing.

SUMMARY

Embodiments of the present disclosure provide a display apparatus that provides high-quality images (e.g., that exhibits improved image reproduction or display) by reducing the reflection of external light. However, this is merely an example, and the scope of the present disclosure is not limited thereto.

Additional aspects and features of the present disclosure will be set forth, in part, in the description which follows and, in part, will be apparent from the description or may be learned by practice of the presented embodiments of the present disclosure.

According to an embodiment of the present disclosure, a display apparatus includes a substrate, a display element on the substrate, a thin-film encapsulation layer on the display element and including a first inorganic encapsulation layer, a first organic encapsulation layer, and a second inorganic encapsulation layer, a first light-shielding layer between the first inorganic encapsulation layer and the first organic encapsulation layer and having a first opening corresponding to an emission area of the display element; and a second light-shielding layer over the thin-film encapsulation layer and having a second opening corresponding to the emission area of the display element.

The first inorganic encapsulation layer may include a first sub-layer including silicon nitride and a second sub-layer including silicon oxycarbide.

A size of the first opening may be less than a size of the second opening.

The display apparatus may further include a pixel-defining layer between the substrate and the thin-film encapsulation layer and having an opening defining the emission area of the display element. A size of the opening in the pixel-defining layer may be less than a size of the first opening.

The display apparatus may further include a spacer between the pixel-defining layer and the thin-film encapsulation layer and having a third opening overlapping the opening of the pixel-defining layer.

The pixel-defining layer may include a light-shielding material.

The third opening may be larger than the first opening and smaller than the second opening.

The thin-film encapsulation layer may further include: a second organic encapsulation layer on the second inorganic encapsulation layer; and a third inorganic encapsulation layer.

The display apparatus may further include a touch sensing layer between the thin-film encapsulation layer and the second light-shielding layer.

The display apparatus may further include a color filter in the second opening in the second light-shielding layer.

The display apparatus may further include a reflection control layer in the second opening in the second light-shielding layer. The reflection control layer may be configured to absorb light in a first wavelength range from about 480 nm to about 505 nm and light in a second wavelength range from about 585 nm to about 605 nm.

According to an embodiment of the present disclosure, a display apparatus includes a substrate, a display element on the substrate, a pixel-defining layer having an opening defining an emission area of the display element, a thin-film encapsulation layer on the display element and including a first inorganic encapsulation layer, a first organic encapsulation layer, and a second inorganic encapsulation layer, a first light-shielding layer between the first inorganic encapsulation layer and the first organic encapsulation layer and having a first opening corresponding to an emission area of the display element, and a second light-shielding layer over the thin-film encapsulation layer and having a second opening corresponding to the emission area of the display element. The first inorganic encapsulation layer has a structure including a plurality of stacked sub-layers.

A size of the first opening may be greater than a size of the opening of the pixel-defining layer and less than a size of the second opening.

The first inorganic encapsulation layer may have a structure including a first sub-layer and a second sub-layer that are stacked on each other and include different materials from each other. The first inorganic encapsulation may have between one dyad and ten dyads.

The first sub-layer may include silicon nitride, and the second sub-layer may include silicon oxycarbide.

The display apparatus may further include a spacer between the pixel-defining layer and the thin-film encapsulation layer and having a third opening overlapping the opening in the pixel-defining layer. The pixel-defining layer may include a light-shielding material.

The third opening may be larger than the first opening and smaller than the second opening.

The thin-film encapsulation layer may further include: a second organic encapsulation layer on the second inorganic encapsulation layer; and a third inorganic encapsulation layer. The first inorganic encapsulation layer may include different materials from the second inorganic encapsulation layer and the third inorganic encapsulation layer.

The display apparatus may further include a touch sensing layer between the thin-film encapsulation layer and the second light-shielding layer.

The display apparatus may further include a color filter in the second opening in the second light-shielding layer.

BRIEF DESCRIPTION OF THE DRAWINGS

The above and other aspects and features of embodiments of the present disclosure will be more apparent from the following description taken in conjunction with the accompanying drawings, in which.

DETAILED DESCRIPTION

Figure 1:
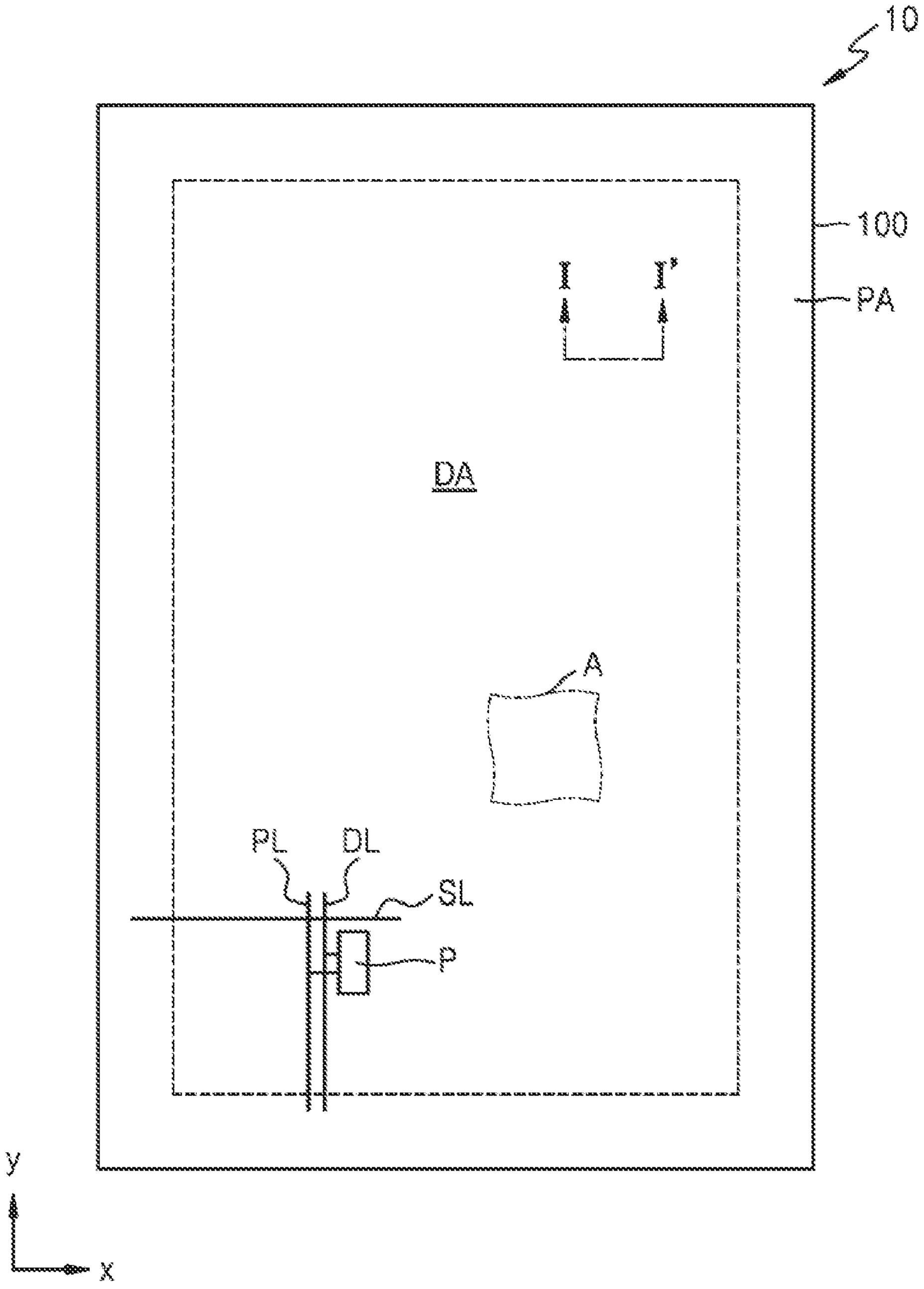
FIG. 1 is a schematic plan view of a display apparatus according to an embodiment.

Reference will now be made, in detail, to embodiments, examples of which are illustrated in the accompanying drawings. The described embodiments may have different forms and should not be construed as being limited to the descriptions set forth herein. Accordingly, embodiments are merely described below, by referring to the figures, to explain aspects and features of the present description. Because the disclosure allows for various changes and numerous embodiments, some embodiments will be shown in the drawings and described, in detail, in the written description. The attached drawings illustrate some embodiments of the present disclosure to provide a sufficient understanding of the present disclosure, the merits thereof, and the objectives accomplished by the implementation of the present disclosure. The present disclosure may, however, be embodied in many different forms and should not be construed as being limited to the embodiments set forth herein.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

In the following examples, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

Hereinafter, embodiments of the present disclosure will be described, in detail, with reference to the accompanying drawings.

FIG. 1 is a schematic plan view of a display apparatus according to an embodiment.

Referring to FIG. 1, a substrate 100 of a display apparatus 10 may be divided into (e.g., may have) a display area DA and a peripheral area PA around (e.g., surrounding a periphery of) the display area DA. The display apparatus 10 may provide (or may display) images by using light emitted from pixels P arranged in the display area DA.

Each pixel P may include a display element, such as an organic light-emitting diode or an inorganic light-emitting diode, and may emit, for example, red light, green light, blue light, or white light. For example, each pixel P may be connected to a pixel circuit including a thin-film transistor TFT, a storage capacitor, or the like. Such a pixel circuit may be connected to a scan line SL, a data line DL crossing the scan line SL, and a driving power line PL. The scan line SL may extend in an x direction, and the data line DL and the driving power line PL may each extend in a y direction.

While the pixel circuit is driven, each pixel P may emit light, and in the display area DA, images are provided (or displayed) according to the light emitted from the pixels P. In the present specification, the pixel P may be defined as an emission area where any one of red light, green light, blue light, and white light is emitted, as described above.

The peripheral area PA is an area where no pixels P are arranged and from where images are not provided (or displayed). Embedded driving circuitry for driving the pixels P, power supply lines, a terminal connected to a printed circuit board or a driver IC including driving circuitry, and the like may be arranged in the peripheral area PA.

The display apparatus 10 may include an organic light-emitting display, an inorganic EL display, a quantum dot light-emitting display, or the like. Hereinafter, an embodiment in which the display apparatus is an organic light-emitting display apparatus is described as an example, but the present disclosure is not limited thereto. The features described below may be applied to various types of display apparatuses stated above.

Figure 2:
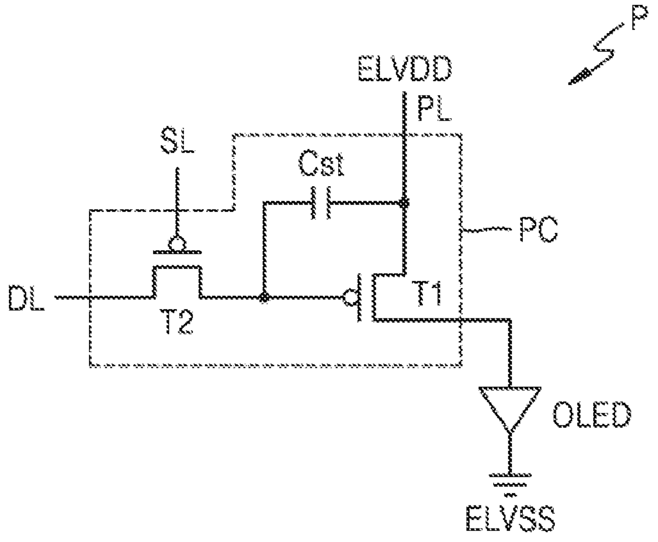
FIG. 2 is a schematic view of a display element included in a pixel of a display apparatus and a pixel circuit connected to the display element according to an embodiment.

FIG. 2 shows a display element included in any one of pixels of a display apparatus and a pixel circuit connected to the display element according to an embodiment.

Referring to FIG. 2, an organic light-emitting diode OLED, which is a display element, is connected to a pixel circuit PC. The pixel circuit PC may include a first thin-film transistor T1, a second thin-film transistor T2, and a storage capacitor Cst. The organic light-emitting diode OLED may emit, for example, red light, green light, or blue light or may emit red light, green light, blue light, or white light.

The second thin-film transistor T2 is a switching thin-film transistor and may be connected to the scan line SL and the data line DL and configured to transmit, to the first thin-film transistor T1, a data voltage that is input through the data line DL according to (e.g., in response to) a switching voltage input through the scan line SL. The storage capacitor Cst may be connected to the second thin-film transistor T2 and the driving power line PL to store a voltage corresponding to a difference between a voltage from the second thin-film transistor T2 and a first power voltage ELVDD provided to the driving power line PL.

The first thin-film transistor T1 is a driving thin-film transistor and may be connected to the driving power line PL and the storage capacitor Cst and configured to control a driving current flowing in (or flowing to) the organic light-emitting diode OLED from the driving power line PL according to (e.g., in response to) the voltage stored in the storage capacitor Cst. The organic light-emitting diode OLED may emit light having a certain brightness because of the driving current. An opposite electrode (e.g., a cathode) of the organic light-emitting diode OLED may receive a second power voltage ELVSS.

FIG. 2 shows an embodiment in which the pixel circuit PC includes two thin-film transistors and one storage capacitor, but according to other embodiments, the number of thin-film transistors and the number of storage capacitors may vary according to the design of the pixel circuit PC.

Figure 3A:
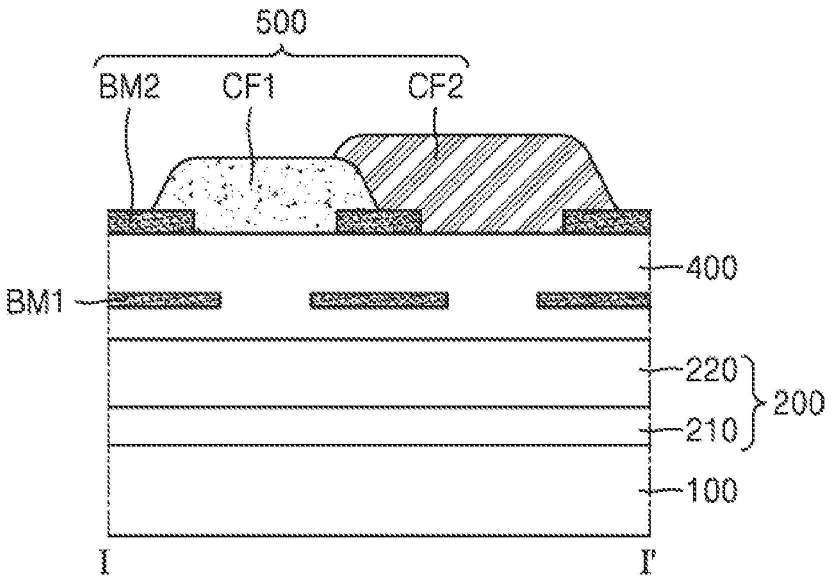
FIGS. 3A and 3B are schematic cross-sectional views of a display apparatus taken along the line I-I' of FIG. 1 according to embodiments.
Figure 3B:
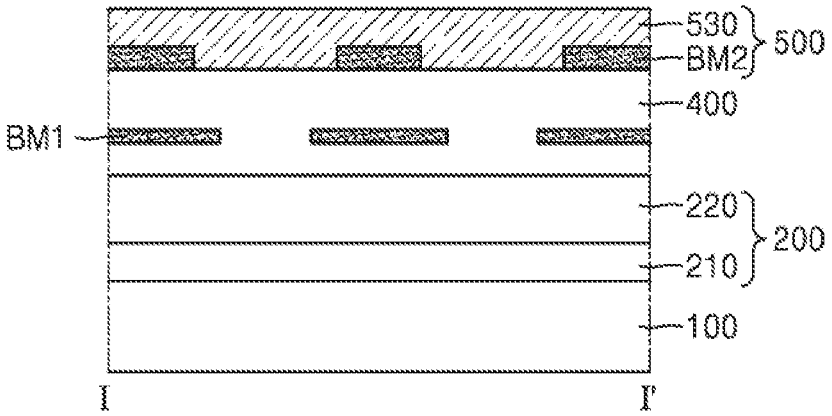

FIGS. 3A and 3B are schematic cross-sectional views of a display apparatus taken along the line I-I' of FIG. 1 according to embodiments.

Referring to FIGS. 3A and 3B, in a display apparatus according to an embodiment, a display layer 200 may be disposed on a substrate 100, and a thin-film encapsulation layer 400 and an optical layer 500 may be disposed over the display layer 200. In some embodiments, a first light-shielding layer BM1 may be arranged in the thin-film encapsulation layer 400, and a second light-shielding layer BM2 may be arranged in the optical layer 500.

The substrate 100 may include polymer resin or a glass material. The substrate 100 including polymer resin may be flexible, rollable, or bendable. The display layer 200 may include a display element layer 220 including a plurality of display elements, and a pixel circuit layer 210 including a plurality of pixel circuits respectively connected to the display elements. Each of the display elements included in the display element layer 220 may define a pixel, and the pixel circuit layer 210 may include a plurality of transistors and a plurality of storage capacitors.

The thin-film encapsulation layer 400 is disposed on the display layer 200. The thin-film encapsulation layer 400 may prevent the display elements from being damaged by external impurities, such as moisture. The thin-film encapsulation layer 400 may include at least one inorganic thin-film encapsulation layer and at least one organic thin-film encapsulation layer.

The first light-shielding layer BM1 may be arranged in the thin-film encapsulation layer 400. The first light-shielding layer BM1 may include a black matrix and may shield most of the light in a region (e.g., in a visible region). The first light-shielding layer BM1 may be arranged between emission areas of the display elements. In other embodiments, the first light-shielding layer BM1 may be a layer have openings respectively corresponding to the emission areas of the display elements. Accordingly, light emitted from the display elements may be emitted to the outside through the openings in the first light-shielding layer BM1.

The optical layer 500 may be disposed on the thin-film encapsulation layer 400. The optical layer 500 may decrease the reflectivity of light (e.g., of external light) that is incident to the display apparatus 10 from the outside and may include components for improving the emission efficiency of light emitted from the display elements.

Referring to FIG. 3A, the optical layer 500 may include the second light-shielding layer BM2 and color filters CF1 and CF2. The second light-shielding layer BM2 may include a black matrix and may shield most of the light in the region (e.g., the visible region). The second light-shielding layer BM2 may be arranged between the emission areas of the display elements. In other embodiments, the second light-shielding layer BM2 may be a layer having openings respectively corresponding to the emission areas of the display elements. The openings in (or the positions of) the second light-shielding layer BM2 may overlap the openings in (of the positions of) the first light-shielding layer BM1, and thus, the light from the display elements may be emitted to the outside through the openings in the second light-shielding layer BM2. The color filters CF1 and CF2 may be arranged corresponding to the display elements, respectively. The color filters CF1 and CF2 may be arranged to correspond to the openings in the second light-shielding layer BM2. The color filters CF1 and CF2 may include a first color filter CF1, a second color filter CF2, and a third color filter, which have different colors from each other. The first color filter CF1, the second color filter CF2, and the third color filter may be a red color filter, a green color filter, and a blue color filter, respectively.

Referring to FIG. 3B, the optical layer 500 may include a reflection control layer 530 instead of the color filters. For example, the optical layer 500 may include the second light-shielding layer BM2 and the reflection control layer 530. The reflection control layer 530 may include a dye and/or a pigment and may absorb light in a certain wavelength band. For example, the reflection control layer 530 may absorb light in a first wavelength range from about 480 nm to about 505 nm and light in a second wavelength range from about 585 nm to about 605 nm, and the light transmittance in the first wavelength range and the second wavelength range may each be equal to or less than about 50%. For example, the reflection control layer 530 may absorb light having a wavelength outside of a wavelength range of red light, green light, or blue light of (or emitted by) the display elements. The reflection control layer 530 may be arranged to correspond to the openings in the second light-shielding layer BM2. The reflection control layer 530 may be commonly arranged on the display elements. The reflection control layer 530 may be equally arranged on the display elements.

A cover window may be disposed over the optical layer 500. The cover window may be attached to the optical layer 500 by a transparent adhesive member, such as an optically clear adhesive film.

Figure 4A:
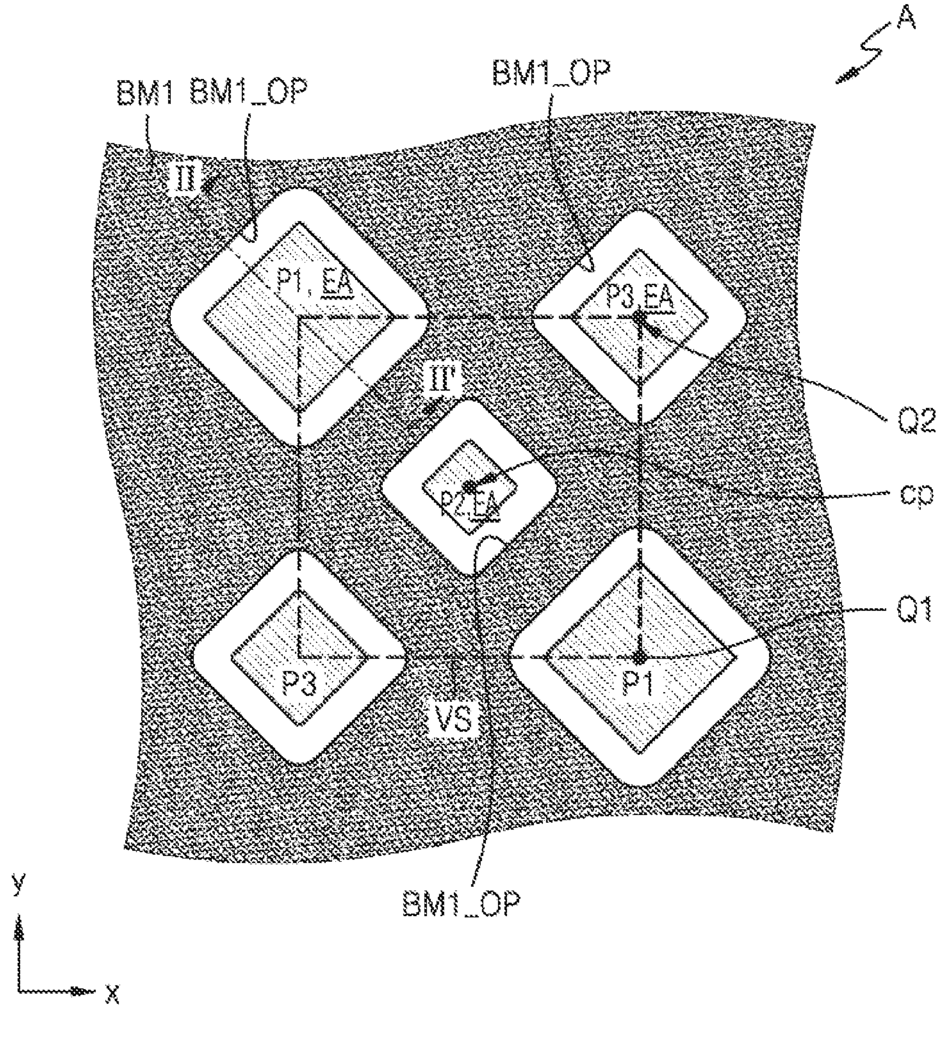
FIGS. 4A and 4B are plan views of the region A in FIG. 1 according to embodiments.
Figure 4B:
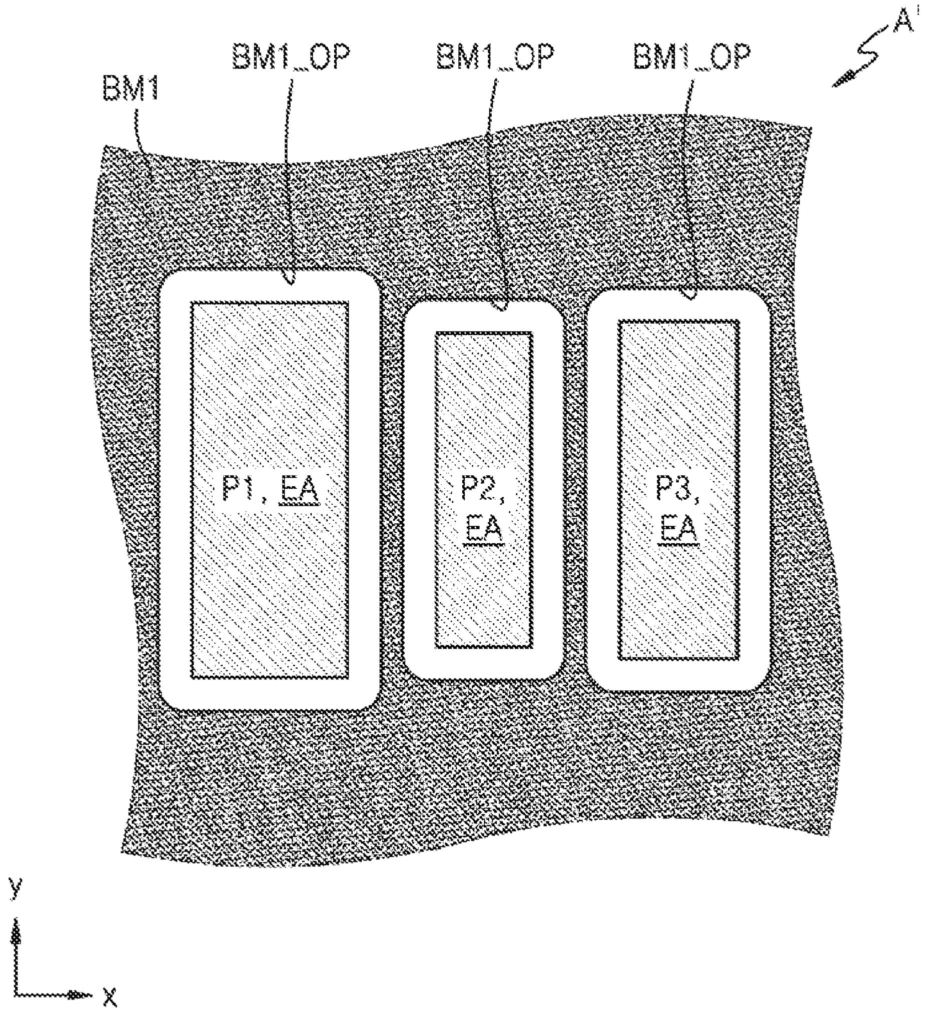

FIGS. 4A and 4B are plan views of some components in the region A in FIG. 1 and schematically show arrangements of pixels and openings BM1_OP in the first light-shielding layer BM1, which respectively correspond to emission areas EA of the pixels.

Referring to FIG. 4A, the display apparatus may include the pixels, and the pixels may include first pixels P1, second pixels P2, and third pixels P3, which emit different color light. For example, the first pixel P1, the second pixel P2, and the third pixel P3 may emit blue light, green light, and red light, respectively. However, the present disclosure is not limited thereto, and various modifications may be made to the pixels. For example, the first pixel P1, the second pixel P2, and the third pixel P3 may emit red light, green light, and blue light, respectively.

The first pixel P1, the second pixel P2, and the third pixel P3 may each have a square shape from among polygonal shapes. In the present specification, polygonal shapes and a square shape include a square shape with rounded vertices (e.g., rounded corners). For example, each of the first pixel P1, the second pixel P2, and the third pixel P3 may have a square shape with rounded vertices. In another embodiment, each of the first pixel P1, the second pixel P2, and the third pixel P3 may have a circular or oval shape.

Sizes of the first pixel P1, the second pixel P2, and the third pixel P3 may be different from each other. For example, an area of the second pixel P2 may be less than areas of the first pixel P1 and the third pixel P3, and the area of the first pixel P1 may be greater than the area of the third pixel P3. However, the present disclosure is not limited thereto, and various modifications may be made to the pixels. For example, the sizes of the first pixel P1, the second pixel P2, and the third pixel P3 may be substantially the same as each other.

Figure 5:
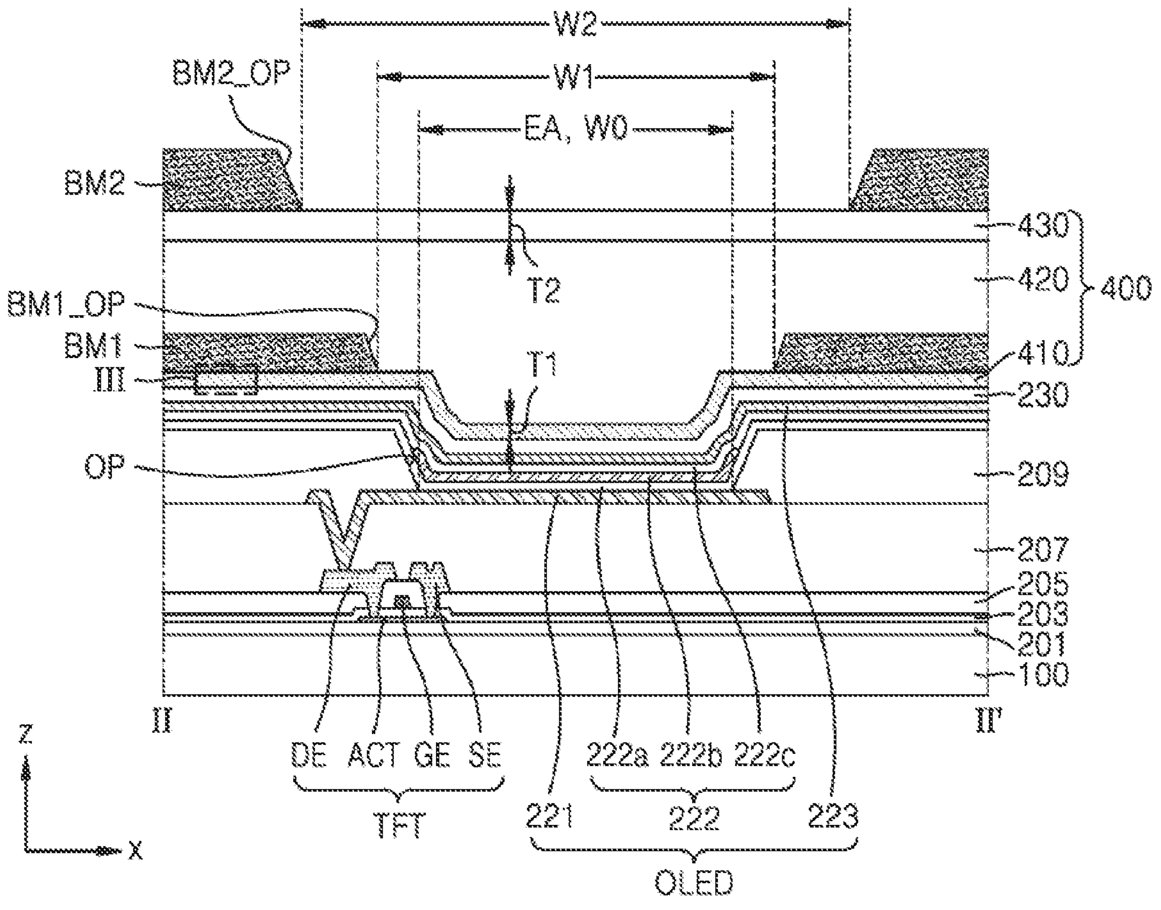
FIG. 5 is a schematic cross-sectional view of a display apparatus taken along the line II-II' of FIG. 4A according to an embodiment.

In the present specification, the sizes of the first pixel P1, the second pixel P2, and the third pixel P3 indicate sizes of the emission areas EA of the display elements realizing respective pixels, and the emission area EA may be defined by an opening OP in a pixel-defining layer (e.g., 209 in FIG. 5).

The first light-shielding layer BM1 disposed on a display element layer has the first opening BM1_OP corresponding to each pixel. The first opening BM1_OP is a region from which a portion of the first light-shielding layer BM1 is removed, and light from the display element may be emitted to the outside through the first opening BM1_OP. A body of the first light-shielding layer BM1 may include a material that absorbs external light, and thus, the visibility of the display apparatus may be improved.

In a plan view, the first opening BM1_OP in the first light-shielding layer BM1 may surround (e.g., may correspond to a periphery of) each of the first to third pixels P1 to P3. In an embodiment, the first opening BM1_OP in the first light-shielding layer BM1 may have a square shape with rounded edges. An area of the first opening BM1_OP in the first light-shielding layer BM1, which corresponds to each of the first to third pixels P1 to P3, may be greater than the area of each of the first to third pixels P1 to P3. However, the present disclosure is not limited thereto, and in some embodiments, the area of the first opening BM1_OP in the first light-shielding layer BM1 may be substantially the same as the area of each of the first to third pixels P1 to P3.

The first pixel P1, the second pixel P2, and the third pixel P3 may be arranged in a PenTile® (a registered trademark of Samsung Display Co., Ltd.) form or arrangement, as referred as to a diamond form or arrangement. For example, the first pixels P1 may be located on first vertices Q1 of a virtual quadrangle VS having the second pixel P2 at a center point CP of the virtual quadrangle VS, and the third pixels P3 may be located on second vertices Q2 of the virtual quadrangle VS. The virtual quadrangle VS may be a square.

The first pixel P1 may be spaced apart from the second pixel P2, and a center point of the first pixel P1 may be located on the first vertex Q1 of the virtual quadrangle VS. The first pixel P1 is provided in plural, and the first pixels P1 are spaced apart from each other with the second pixel P2 therebetween.

The third pixel P3 is spaced apart from the first pixel P1 and the second pixel P2, and a center point of the third pixel P3 is located on the second vertex Q2 that is adjacent to the first vertex Q1 of the virtual quadrangle VS. The third pixel P3 is provided in plural, and the third pixels P3 are spaced apart from each other with the first pixels P1 therebetween.

The first pixels P1 and the third pixels P3 may be alternately arranged in an x direction and a y direction crossing the x direction. The first pixels P1 may be surrounded by (e.g., surrounded in a plan view by) the second pixels P2 and the third pixels P3.

FIG. 4A shows that an arrangement of the first pixels P1, the second pixels P2, and the third pixels P3 in a PenTile® structure, but the present disclosure is not limited thereto.

For example, the first pixels P1, the second pixels P2, and the third pixels P3 may be arranged in a stripe form or arrangement, as shown in FIG. 4B. For example, the first pixels P1, the second pixels P2, and the third pixels P3 may be sequentially arranged in the x direction. In other embodiments, the first pixels P1, the second pixels P2, and the third pixels P3 may be arranged in various forms or arrangements including a mosaic form, a delta form, etc. The display apparatus, according to the illustrated embodiments, includes the first pixels P1, the second pixels P2, and the third pixels P3, which emit different colors of light, and the first light-shielding layer BM1 has the first opening BM1_OP corresponding to each of the first to third pixels P1 to P3.

Hereinafter, the display apparatus according to an embodiment is described in detail according to a stack order shown in FIG. 5.

Figure 6A:
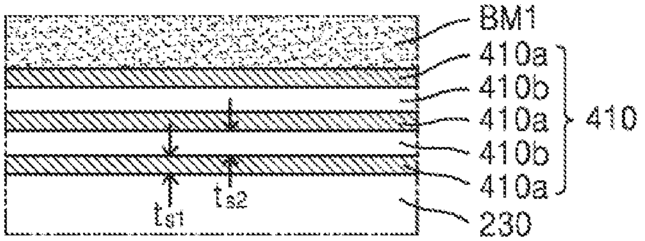
FIGS. 6A and 6B are diagrams of the enlarged region III in FIG. 5 showing a portion of a first inorganic encapsulation layer according to embodiments.
Figure 6B:
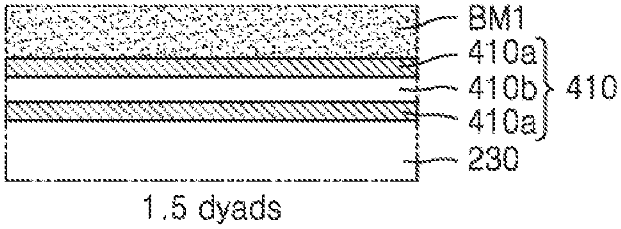

FIG. 5 is a schematic cross-sectional view of a display apparatus according to an embodiment and shows a cross-section taken along the line II-II' of FIG. 4A. FIGS. 6A and 6B are diagrams of the enlarged region III in FIG. 5 and show a portion of a first inorganic encapsulation layer according to embodiments.

Referring to FIG. 5, a display apparatus, according to an embodiment, includes an organic light-emitting diode OLED disposed over the substrate 100 as a display element having an emission area EA, a thin-film encapsulation layer 400, a first light-shielding layer BM1 arranged in the thin-film encapsulation layer 400, and a second light-shielding layer BM2 disposed on the thin-film encapsulation layer 400. In an embodiment, the display apparatus may further include a capping layer 230 disposed between the organic light-emitting diode OLED and the thin-film encapsulation layer 400.

The substrate 100 may be a single layer including a glass material. In other embodiments, the substrate 100 may include polymer resin. The substrate 100 including polymer resin may have a structure in which a layer including polymer resin and an inorganic layer are stacked. In an embodiment, the substrate 100 may include polymer resin, such as polyethersulfone, polyarylate, polyetherimide, polyethylene naphthalate, polyethylene terephthalate, polyphenylene sulfide, polyimide, polycarbonate, cellulose triacetate, and/or cellulose acetate propionate, and may be flexible. The substrate 100 may include glass including silicon oxide (e.g., $SiO_2$) as a main component or may include a resin, such as reinforced plastic, and may be rigid.

The thin-film transistor TFT may include a semiconductor layer Act including amorphous silicon, polycrystalline silicon, or an organic semiconductor material, a gate electrode GE, a source electrode SE, and a drain electrode DE. A gate insulating layer 203 including an inorganic material, such as silicon oxide ($SiO_x$), silicon nitride ($SiN_x$), and/or silicon oxynitride ($SiO_xN_y$), may be arranged between the semiconductor layer Act and the gate electrode GE to insulate the semiconductor layer Act from the gate electrode GE. In addition, an interlayer insulating layer 205 including an inorganic material, such as $SiO_x$, $SiN_x$, and/or $SiO_xN_y$, may be disposed on the gate electrode GE, and the source electrode SE and the drain electrode DE may be disposed on the interlayer insulating layer 205. An insulating layer including an inorganic material may be formed through Chemical Vapor Deposition (CVD) or Atomic Layer Deposition (ALD).

The gate electrode GE, the source electrode SE, and the drain electrode DE may include various conductive materials. The gate electrode GE may include at least one of molybdenum (Mo), aluminum (Al), copper (Cu), and titanium (Ti) and may have a multilayer structure in some embodiments. For example, the gate electrode GE may be a single Mo layer or may have a three-layer structure including an Mo layer, an Al layer, and an Mo layer. The source electrode SE and the drain electrode DE may each include at least one of Cu, Ti, and Al and may have a multilayer structure in some embodiments. For example, the source electrode SE and the drain electrode DE may each have a three-layer structure including a Ti layer, an Al layer, and a Ti layer.

A buffer layer 201 may be arranged between the thin-film transistor TFT having the above-described structure and the substrate 100, the buffer layer 201 may include an inorganic material, such as $SiO_x$, $SiN_x$, and/or $SiO_xN_y$. The buffer layer 201 may increase the flatness of an upper surface of the substrate 100 or may prevent or decrease penetration of impurities to the semiconductor layer Act of the thin-film transistor TFT from the substrate 100, etc.

A planarization insulating layer 207 may be disposed on the thin-film transistor TFT. The planarization insulating layer 207 may include an organic material, for example, acryl, benzocyclobutene (BCB), hexamethyldisiloxane (HMDSO), or the like. FIG. 5 shows an embodiment in which the planarization insulating layer 207 is a single layer, but in other embodiments, the planarization insulating layer 207 may have a multilayer structure.

The organic light-emitting diode OLED may be disposed on the planarization insulating layer 207 and may be connected to the thin-film transistor TFT through a contact hole (e.g., a contact opening). The organic light-emitting diode OLED may include a pixel electrode 221, an intermediate layer 222 including an emission layer 222*b*, and an opposite electrode 223.

The pixel electrode 221 may be disposed on the planarization insulating layer 207. A pixel electrode 221 is arranged in each pixel. The pixel electrodes 221 respectively corresponding to adjacent pixels may be arranged apart from (e.g., may be spaced apart from) each other.

The pixel electrode 221 may be a reflection electrode. In some embodiments, the pixel electrode 221 may include a reflection layer including silver (Ag), magnesium (Mg), aluminum (Al), platinum (Pt), palladium (Pd), gold (Au), nickel (Ni), neodymium (Nd), iridium (Ir), chromium (Cr), and a compound thereof, and a transparent or translucent electrode layer may be formed on the reflection layer. The transparent or translucent electrode layer may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 221 may have a three-layer structure including an ITO layer, an Ag layer, and an ITO layer.

The pixel-defining layer 209 is disposed on (e.g., on an edge of) the pixel electrode 221 and on the planarization insulating layer 207. The pixel-defining layer 209 has an opening OP exposing a central portion of each pixel electrode 221. The pixel-defining layer 209 may cover edges of the pixel electrode 221 and may increase a distance between the edges of the pixel electrode 221 and the opposite electrode 223, thereby preventing arcs, etc. from being generated at the edges of the pixel electrode 221. The pixel-defining layer 209 may include organic insulating materials, such as polyimide, polyamide, acrylic resin, BCB, HMDSO, and phenol resin, and may be formed through spin coating, etc. In other embodiments, the pixel-defining layer 209 may include an inorganic insulating material. In some embodiments, the pixel-defining layer 209 may have a multilayer structure including an inorganic insulating material and an organic insulating material.

The emission layer 222*b* may be arranged in the opening OP in the pixel-defining layer 209. The emission layer 222*b* may include an organic material including a fluorescent material or a phosphorescent material for emitting red light, green light, or blue light. The organic material may be a low-molecular-weight organic material or a high-molecular-weight organic material.

A first common layer 222*a* and a second common layer 222*c* may be disposed on and under the emission layer 222*b*, respectively. The first common layer 222*a* may include, for example, a Hole Transport Layer (HTL) or both an HTL and a Hole Injection Layer (HIL). The second common layer 222*c* may be a component disposed on the emission layer 222*b* and may include an Electron Transport Layer (ETL) and/or an Electron Injection Layer (EIL). The second common layer 222*c* may be omitted in some embodiment.

The emission layer 222*b* may be arranged in each pixel to correspond to (e.g., to be in) the opening OP in the pixel-defining layer 209, but similar to the opposite electrode 223 described below, the first common layer 222*a* and the second common layer 222*c* may be a common layer formed as a single body to entirely cover the substrate 100, for example, to cover the entire display area DA of the substrate 100.

The opposite electrode 223 may be a cathode that is an electron injection electrode, and in such an embodiment, may be formed of metal having a low work function, alloys, an electrically conductive compound, or an arbitrary combination thereof. The opposite electrode 223 may be a transmissive electrode, a semi-transmissive electrode, or a reflection electrode.

The opposite electrode 223 may include lithium (Li), Ag, Mg, Al, Al—Li, calcium (Ca), Mg—In, Mg—Ag, ytterbium (Yb), Ag—Yb, ITO, IZO, or an arbitrary combination thereof. The opposite electrode 223 may have a single-layer structure including a single layer or may have a multilayer structure including multiple layers.

The capping layer 230 may be configured to improve the external emission efficiency of an organic light-emitting diode according to the principle of constructive interference. The capping layer 230 may include a material having a refractive index of greater than or equal to about 1.6 (at 589 nm). A thickness of the capping layer 230 may be in a range between about 1 nm and about 200 nm, for example, between about 5 nm and about 150 nm or between about 10 nm and about 100 nm.

The capping layer 230 may include an organic capping layer including an organic material, an inorganic capping layer including an inorganic material, and a compound capping layer including an organic material and an inorganic material.

For example, the capping layer 230 may include a carbocyclic compound, a heterocyclic compound, an amine group-containing compound, porphine derivatives, phthalocyanine derivatives, naphthalocyanine derivatives, alkali metal complexes, alkali earth metal complexes, or an arbitrary combination thereof. The carbocyclic compound, the heterocyclic compound, and the amine group-containing compound may be optionally substituted with a substituent including oxygen (O), nitrogen (N), sulfur (S), selenium (Se), silicon (Si), fluorine (F), chlorine (Cl), bromine (Br), iodine (I), or an arbitrary combination thereof.

The thin-film encapsulation layer 400 may be disposed on the capping layer 230 and may seal the organic light-emitting diodes OLED. The thin-film encapsulation layer 400 may include at least one inorganic encapsulation layer and at least one organic encapsulation layer. For example, as shown in FIG. 5, the thin-film encapsulation layer 400 may include a first inorganic encapsulation layer 410, a first organic encapsulation layer 420, and a second inorganic encapsulation layer 430.

The first inorganic encapsulation layer 410 and the second inorganic encapsulation layer 430 may include one or more inorganic insulating materials selected from among aluminum oxide (e.g., $Al_2O_3$), titanium oxide (e.g., $TiO_2$), tantalum oxide (e.g., $Ta_2O_5$), hafnium oxide (e.g., $HfO_2$), zinc oxide (e.g., ZnO), $SiO_x$, $SiN_x$, $SiO_xN_y$, and silicon oxycarbide ($SiOC_x$) (x>0).

The first organic encapsulation layer 420 may relieve an internal stress of the first inorganic encapsulation layer 410 and/or the second inorganic encapsulation layer 430. The first organic encapsulation layer 420 may include a polymer-based material. The polymer-based material may include polyethylene terephthalate, polyethylene naphthalate, polycarbonate, polyimide, polyethylene sulfonate, polyoxyethylene, polyarylate, HMDSO, acrylic resin (e.g., polymethylmethacrylate (PMMA), polyacrylic acid, etc.), or an arbitrary combination thereof.

The first organic encapsulation layer 420 may be formed by spreading a monomer having flowability (e.g., by spreading a flowable monomer) and then hardening the monomer layer by using heat or light (e.g., ultraviolet rays). In other embodiments, the first organic encapsulation layer 420 may be formed by spreading the above-described polymer-based material and patterning the same. For example, the first organic encapsulation layer 420 may include an acryl-based material having low permittivity and may be formed through a photomask process.

Even if cracks form in the thin-film encapsulation layer 400, due to the aforementioned multilayer structure thereof, such cracks may be prevented from propagating between the first inorganic encapsulation layer 410 and the first organic encapsulation layer 420 or between the first organic encapsulation layer 420 and the second inorganic encapsulation layer 430. Thus, formation of a path through which external moisture, oxygen, etc. could penetrate into the display area DA may be prevented or reduced.

In some embodiments, the first inorganic encapsulation layer 410 may include a different material and may have a different structure from the second inorganic encapsulation layer 430. As shown in FIGS. 6A and 6B, the first inorganic encapsulation layer 410 may be formed as a plurality of sub-layers 410*a* and 410*b* that are stacked. The sub-layers 410*a* and 410*b* may be distinguishable from each other, and respective thicknesses $t_{s1}$ and $t_{s2}$ of the sub-layers 410*a* and 410*b* may be less than a thickness T2 of the second inorganic encapsulation layer 430. For example, the thicknesses $t_{s1}$ and $t_{s2}$ of the sub-layers 410*a* and 410*b* may each be in a range of about 0.01 times to about 0.1 times the thickness T2 of the second inorganic encapsulation layer 430. In some embodiments, the thicknesses $t_{s1}$ and $t_{s2}$ of the sub-layers 410*a* and 410*b* may each be in a range between about 100 Å and about 1000 Å, and the thickness T2 of the second inorganic encapsulation layer 430 may be about several micrometers (μm).

In some embodiments, the first inorganic encapsulation layer 410 may include the first sub-layer 410*a* including $SiN_x$ and the second sub-layer 410*b* including $SiOC_x$ and being alternately stacked. The first sub-layer 410*a* and the second sub-layer 410*b* may be formed to have a dense structure through Plasma Enhanced Chemical Vapor Deposition (PECVD), ALD, or the like. Accordingly, although the thicknesses of the first sub-layer 410*a* and the second sub-layer 410*b* are relatively small, the sealing characteristics thereof may be maintained.

In some embodiments, a total thickness T1 of the first inorganic encapsulation layer 410 may be less than the thickness T2 of the second inorganic encapsulation layer 430. Because each of the sub-layers 410*a* and 410*b* of the first inorganic encapsulation layer 410 has a relatively very small thickness and is dense, the total thickness T1 of the first inorganic encapsulation layer 410 may be less than the thickness T2 of the second inorganic encapsulation layer 430.

When one first sub-layer 410*a* and one second sub-layer 410*b* are stacked, the first inorganic encapsulation layer 410 is described as including sub-layers having one dyad. In some embodiments, the first inorganic encapsulation layer 410 may have one dyad to ten dyads. FIG. 6A shows an embodiment in which the first inorganic encapsulation layer 410 has 2.5 dyads, and FIG. 6B shows an embodiment in which the first inorganic encapsulation layer 410 has 1.5 dyads.

Referring to FIG. 6A, the first inorganic encapsulation layer 410 may have a structure in which the first sub-layer 410*a*/the second sub-layer 410*b*/the first sub-layer 410*a*/the second sub-layer 410*b*/the first sub-layer 410*a*, that is, five sub-layers in total, are sequentially stacked. Such a structure is referred to as a structure stacked having 2.5 dyads.

Referring to FIG. 6B, the first inorganic encapsulation layer 410 may have a structure in which the first sub-layer 410*a*/the second sub-layer 410*b*/the first sub-layer 410*a*, that is, three sub-layers in total, are sequentially stacked. Such a structure is referred to as a structure having 1.5 dyads.

Referring back to FIG. 5, the first light-shielding layer BM1 may be disposed on the first inorganic encapsulation layer 410 included in the thin-film encapsulation layer 400, and the second light-shielding layer BM2 may be disposed on the thin-film encapsulation layer 400. The first light-shielding layer BM1 and the second light-shielding layer BM2 may decrease the reflectivity of light (e.g., external light) that is incident to the display apparatus 10 from the outside and may increase the contrast of light emitted from the display elements.

The second light-shielding layer BM2 is disposed on the thin-film encapsulation layer 400 and has a second opening BM2_OP. The color filters or the reflection control layer may be arranged in the second opening BM2_OP, as described above with reference to FIGS. 3A and 3B.

Because the second light-shielding layer BM2 is disposed on the thin-film encapsulation layer 400, that is, is farther from the organic light-emitting diode OLED that is a display element, a size of the second opening BM2_OP in the second light-shielding layer BM2 may be determined in consideration of a desired lateral viewing angle of the display apparatus. Accordingly, if only the second light-shielding layer BM2 is formed, light may be reflected by members exposed by (or through) the second opening BM2_OP in the second light-shielding layer BM2.

The first light-shielding layer BM1 may shield such reflected light that the second light-shielding layer BM2 fails to shield. The first light-shielding layer BM1 may be arranged inside the thin-film encapsulation layer 400. When the first light-shielding layer BM1 is disposed not in the thin-film encapsulation layer 400 but over the capping layer 230 or the opposite electrode 223, which is disposed under the thin-film encapsulation layer 400, the first light-shielding layer BM1 may be weakly adhered to the capping layer 230 or the opposite electrode 223 because of characteristics of materials included in the first light-shielding layer BM1. Accordingly, when the first light-shielding layer BM1 is disposed under the thin-film encapsulation layer 400, the strength of the display apparatus may decrease.

In the illustrated embodiment, because the first light-shielding layer BM1 is arranged adjacent to the organic light-emitting diode OLED, which is a display element, and in the thin-film encapsulation layer 400, reflected light may be effectively blocked and the strength of the display apparatus may be improved.

The first light-shielding layer BM1 may be disposed on the first inorganic encapsulation layer 410. The first light-shielding layer BM1 may be disposed between the first inorganic encapsulation layer 410 and the first organic encapsulation layer 420. The first organic encapsulation layer 420 may fill the inside of the first opening BM1_OP in the first light-shielding layer BM1.

The first light-shielding layer BM1 has the first opening BM1_OP overlapping the emission area EA of the organic light-emitting diode OLED. The emission area EA may be defined by the opening OP in the pixel-defining layer 209. The second light-shielding layer BM2 has the second opening BM2_OP overlapping the emission area EA of the organic light-emitting diode OLED. The second opening BM2_OP in the second light-shielding layer BM2 overlaps the first opening BM1_OP in the first light-shielding layer BM1.

In some embodiments, the first opening BM1_OP in the first light-shielding layer BM1 may overlap the opening OP in the pixel-defining layer 209, and a first width W1, which is a width of the first opening BM1_OP in the first light-shielding layer BM1, may be greater than a width W0 of the opening OP in the pixel-defining layer 209.

In some embodiments, the second opening BM2_OP in the second light-shielding layer BM2 may overlap the first opening BM1_OP in the first light-shielding layer BM1, and a width W2, which is a width of the second opening BM2_OP in the second light-shielding layer BM2, may be greater than the first width W1 that is the width of the first opening BM1_OP in the first light-shielding layer BM1.

The second opening BM2_OP in the second light-shielding layer BM2 may overlap the opening OP in the pixel-defining layer 209, and the width W2, which is the width of the second opening BM2_OP in the second light-shielding layer BM2, may be greater than the width W0 of the opening OP in the pixel-defining layer 209 (e.g., W2>W1>W0). In some embodiments, an edge of the second opening BM2_OP in the second light-shielding layer BM2 may be spaced outwardly from the edge of the opening OP in the pixel-defining layer 209 by about 3 μm to about 5 μm.

A body portion of the first light-shielding layer BM1 may overlap a body portion of the pixel-defining layer 209. Herein, the body portion of the first light-shielding layer BM1 is a portion distinguished from the first opening BM1_OP in the first light-shielding layer BM1 and has a certain volume. The body portion of the pixel-defining layer 209 is a portion distinguished from the opening OP in the pixel-defining layer 209 and has a certain volume.

As described, a body portion of the second light-shielding layer BM2 may overlap the body portion of the pixel-defining layer 209. Herein, the body portion of the second light-shielding layer BM2 is a portion distinguished from the second opening BM2_OP in the second light-shielding layer BM2 and has a certain volume.

In a plan view, at least a portion of the body portion of the first light-shielding layer BM1 may be arranged in (or arranged to overlap or extend into) the second opening BM2_OP in the second light-shielding layer BM2. Accordingly, a portion of the underlying components that is not shielded by the second light-shielding layer BM2 may be shielded by the first light-shielding layer BM1.

The first light-shielding layer BM1 and the second light-shielding layer BM2 may each have a wavelength spectrum that generally absorbs light in a visible band, that is, a wavelength band in a range from about 380 nm to about 780 nm. The first light-shielding layer BM1 and the second light-shielding layer BM2 may be black. For example, the first light-shielding layer BM1 and the second light-shielding layer BM2 may include organic materials including light-shielding materials. The light-shielding material may include metal particles (e.g., Ni, Al, Mo, or an alloy thereof), metal oxide particles (e.g., chromium oxide), or metal nitride particles (e.g., chromium nitride), carbon black, a carbon nanotube, a resin or a paste including a black dye, or the like.

As described, the display apparatus may include the first light-shielding layer BM1 included in the thin-film encapsulation layer 400 and the second light-shielding layer BM2 disposed on the thin-film encapsulation layer 400, and thus, the strength of the display device and an impression of reflective colors from the display apparatus may be simultaneously improved.

Figure 7:
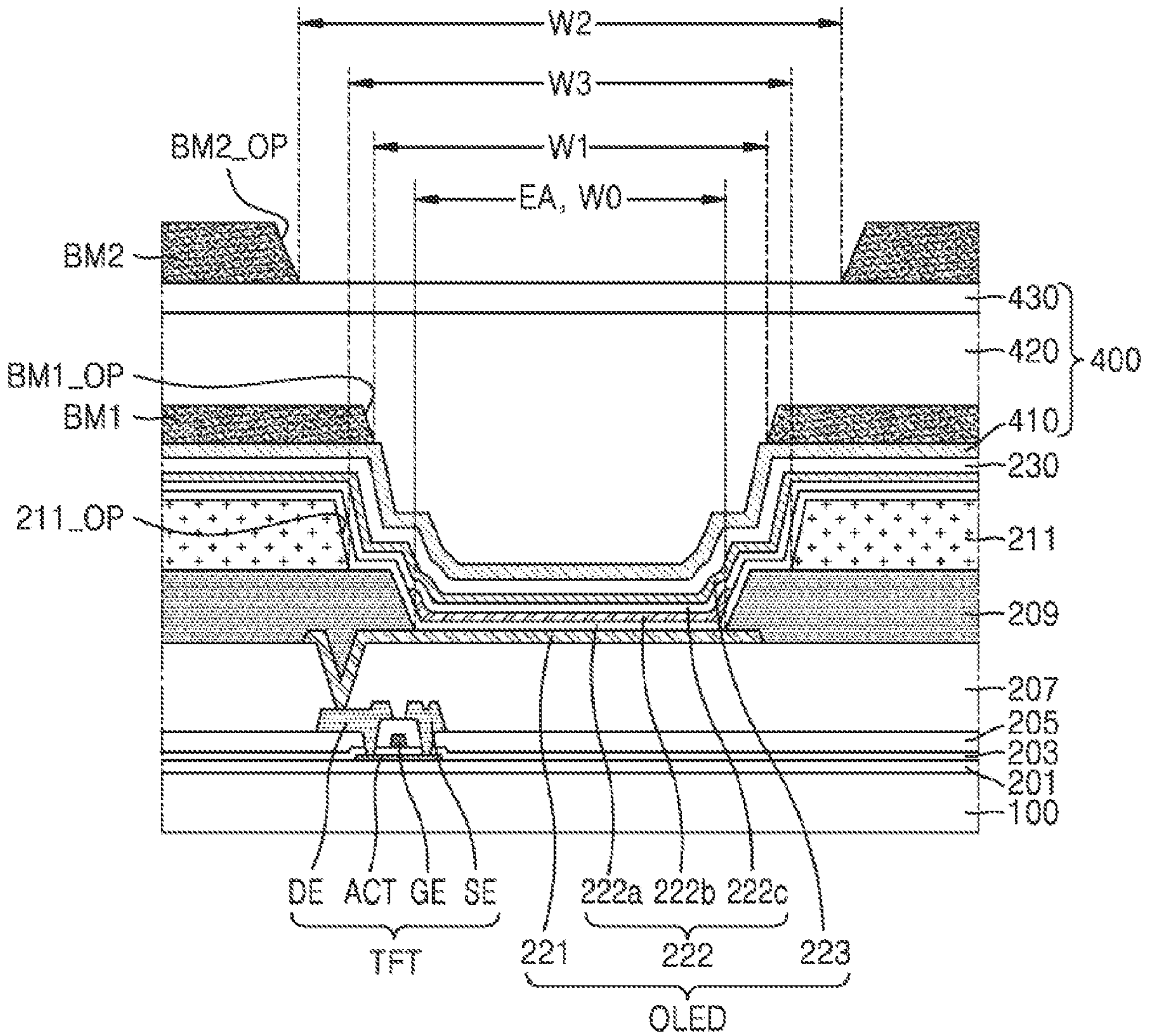
FIG. 7 is a schematic cross-sectional view of a display apparatus according to an embodiment.
Figure 8:
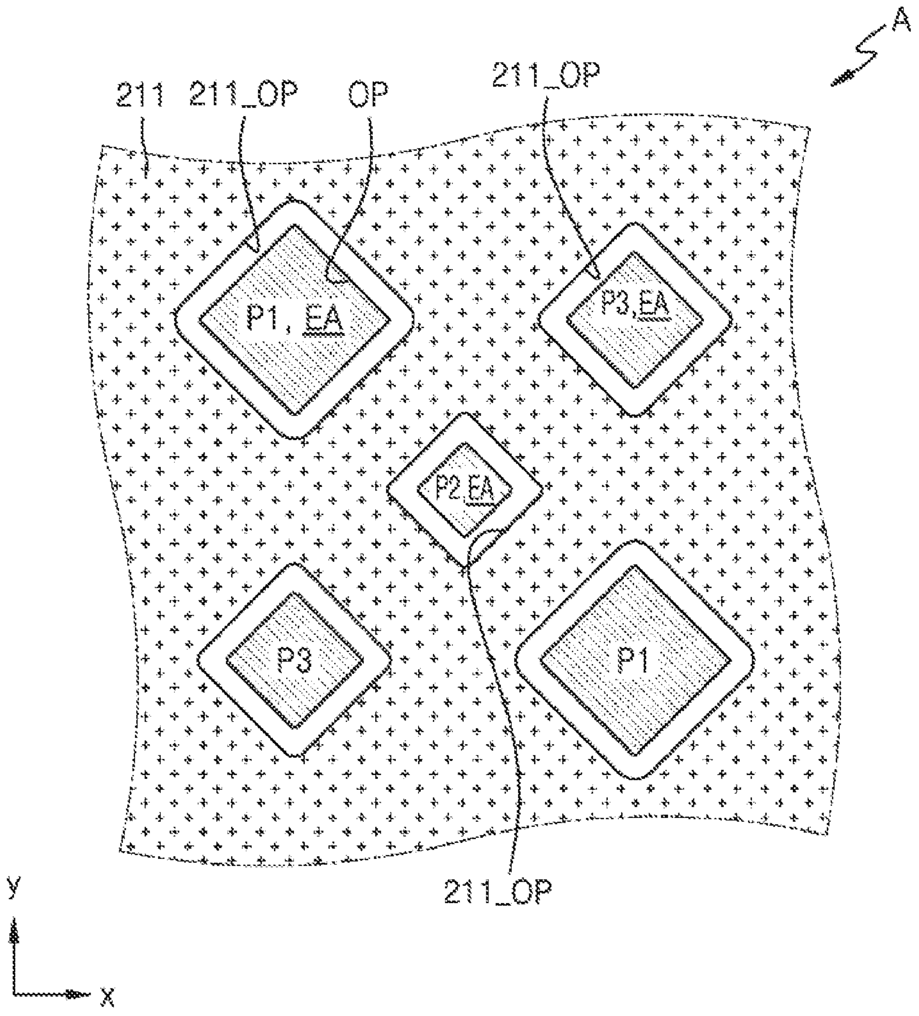
FIG. 8 is a plan view showing some components of the display apparatus shown in FIG. 7.

FIG. 7 is a schematic cross-sectional view of a display apparatus according to an embodiment, and FIG. 8 is a plan layout view showing some components of the display apparatus shown in FIG. 7. The same reference numerals in FIGS. 5, 7, and 8 denote the same elements.

Referring to FIG. 7, a display apparatus according to an embodiment includes an organic light-emitting diode OLED disposed over the substrate 100 as a display element including an emission area EA, a thin-film encapsulation layer 400, a first light-shielding layer BM1 arranged in the thin-film encapsulation layer 400, and a second light-shielding layer BM2 disposed on the thin-film encapsulation layer 400. In an embodiment, the display apparatus may further include a capping layer 230 disposed between the organic light-emitting diode OLED and the thin-film encapsulation layer 400.

The organic light-emitting diode OLED may include a pixel electrode 221, an intermediate layer 222 including an emission layer 222*b*, an opposite electrode 223, and a pixel-defining layer 209. The pixel-defining layer 209 may be disposed over the substrate 100 and has an opening OP, which defines the emission area EA of the organic light-emitting diode OLED.

The pixel-defining layer 209 may include organic insulating materials, such as polyimide, polyamide, acrylic resin, BCB, HMDSO, and phenol resin. In other embodiments, the pixel-defining layer 209 may include an inorganic insulating material. In some embodiments, the pixel-defining layer 209 may have a multilayer structure including an inorganic insulating material and an organic insulating material.

In an embodiment, the pixel-defining layer 209 may include a light-shielding material and may be black. The light-shielding material may include carbon black, a carbon nanotube, a resin or paste including a black dye, metal particles (e.g., Ni, Al, Mo, and an alloy thereof), metal oxide particles (e.g., chromium oxide), metal nitride particles (e.g., chromium nitride), or the like. In an embodiment in which the pixel-defining layer 209 includes the light-shielding material, external light reflected from metal structures disposed under the pixel-defining layer 209 may be reduced.

A spacer 211 may be disposed on the pixel-defining layer 209. The spacer 211 may be disposed between the pixel-defining layer 209 and the opposite electrode 223. The spacer 211 may increase adhesion between the pixel-defining layer 209 and the opposite electrode 223 of the organic light-emitting diode OLED. The spacer 211 may include organic insulating materials, such as polyimide, polyamide, acrylic resin, BCB, HMDSO, and phenol resin. In some embodiments, the spacer 211 may include an insulating material. In some embodiments, the spacer 211 may have a multilayer structure including an insulating material and an organic insulating material.

In an embodiment in which the pixel-defining layer 209 includes a light-shielding material, adhesion between the pixel-defining layer 209 and the opposite electrode 223 may be weakened (or reduced) due to the characteristics of the light-shielding material. Accordingly, the strength of the display apparatus may be reduced. In the illustrated embodiment, the strength of the display apparatus may be increased by placing the spacer 211 between the pixel-defining layer 209 and the opposite electrode 223.

Also, the spacer 211 may prevent damage, such as damage that may be caused by a mask used while forming the emission layer 222*b* is formed, to layers arranged between the substrate 100 and the spacer 211.

The spacer 211 may have a third opening 211_OP overlapping the opening OP in the pixel-defining layer 209. Referring to FIG. 8, the spacer 211 has third openings 211_OP respectively corresponding to the first to third pixels P1 to P3. In a plan view, the third openings 211_OP in the spacer 211 may respectively surround (e.g., may surround a periphery of) the first to third pixels P1 to P3. An area of the third opening 211_OP corresponding to each of the first to third pixels P1 to P3 may be greater than the area of each of the first to third pixels P1 to P3. An area of each pixel may be an area of the opening OP in the pixel-defining layer 209.

Referring back to FIG. 7, a third width W3 that is a width of the third opening 211_OP in the spacer 211 may be greater than the width W0 of the opening OP in the pixel-defining layer 209. In some embodiments, a body portion of the spacer 211 may cover about 90% of the body portion of the pixel-defining layer 209. The body portion of the spacer 211 is a portion distinguished from the third opening 211_OP in the spacer 211 and has a certain volume.

When the spacer 211 is arranged, light may be reflected by the spacer 211. The first light-shielding layer BM1 may shield reflected light generated by the spacer 211. To this end, the body portion of the first light-shielding layer BM1 may be arranged to cover the body portion of the spacer 211. In some embodiments, the first opening BM1_OP in the first light-shielding layer BM1 may overlap the third opening 211_OP in the spacer 211, and the first width W1 that is the width of the first opening BM1_OP in the first light-shielding layer BM1 may be less than the third width W3 that is the width of the third opening 211_OP in the spacer 211 (e.g., W1<W3). Accordingly, the reflected light, which may be generated from side surfaces of the third opening 211_OP in the spacer 211, may be blocked.

The second opening BM2_OP in the second light-shielding layer BM2 may be greater (e.g., may be greater in size) than the third opening 211_OP in the spacer 211 in consideration of the lateral visibility (e.g., the viewing angle) of the display apparatus. For example, the second width W2 may be greater than the third width W3 (e.g., W2>W3).

The first light-shielding layer BM1 may be arranged in the thin-film encapsulation layer 400, for example, between the first inorganic encapsulation layer 410 and the first organic encapsulation layer 420, and the second light-shielding layer BM2 may be disposed on the thin-film encapsulation layer 400, for example, on the second inorganic encapsulation layer 430. Accordingly, the strength and the impression of reflective colors of the display apparatus may be simultaneously improved.

Figure 9:
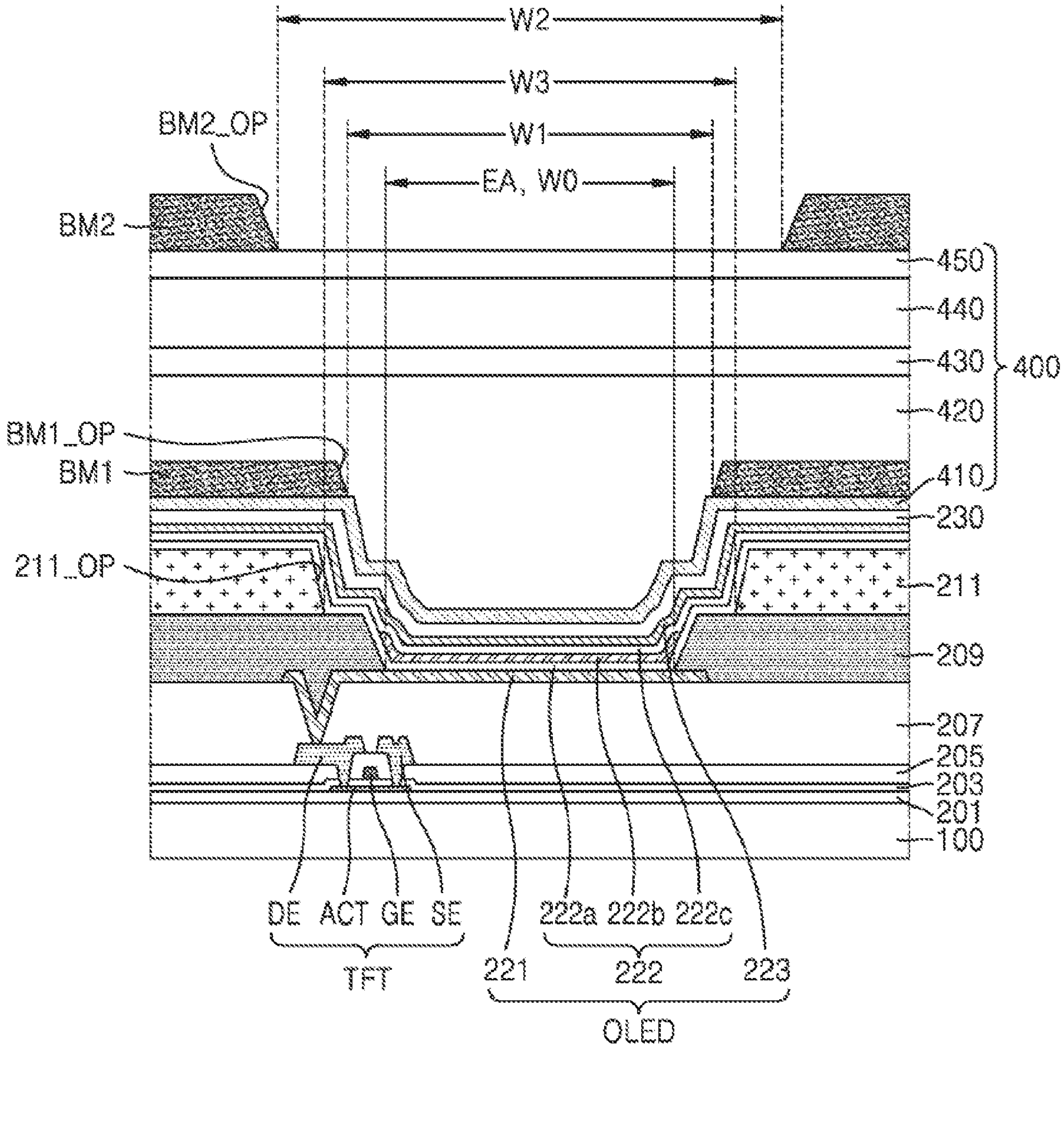
FIG. 9 is a schematic cross-sectional view of a display apparatus according to an embodiment.

FIG. 9 is a schematic cross-sectional view of a display apparatus according to an embodiment. Like reference numerals in FIGS. 7 and 9 denote like elements.

Referring to FIG. 9, a display apparatus according to an embodiment includes an organic light-emitting diode OLED disposed over the substrate 100 as a display element including an emission area EA, a thin-film encapsulation layer 400, a first light-shielding layer BM1 arranged in the thin-film encapsulation layer 400, and a second light-shielding layer BM2 disposed on the thin-film encapsulation layer 400. In an embodiment, the display apparatus may further include a capping layer 230 disposed between the organic light-emitting diode OLED and the thin-film encapsulation layer 400.

In the illustrated embodiment, the thin-film encapsulation layer 400 may include the first inorganic encapsulation layer 410, the first organic encapsulation layer 420, a second inorganic encapsulation layer 430, a second organic encapsulation layer 440, and a third inorganic encapsulation layer 450, which are sequentially stacked.

The first inorganic encapsulation layer 410, the second inorganic encapsulation layer 430, and the third inorganic encapsulation layer 450 may each include one or more inorganic insulating materials selected from among $Al_2O_3$, $TiO_2$, $Ta_2O_5$, $HfO_2$, ZnO, $SiO_x$, $SiN_x$, $SiO_xN_y$, and $SiOC_x$ ($x>0$).

The first organic encapsulation layer 420 and the second organic encapsulation layer 440 may each include a polymer-based material. The polymer-based material may include polyethylene terephthalate, polyethylene naphthalate, polycarbonate, polyimide, polyethylene sulfonate, polyoxyethylene, polyarylate, HMDSO, acrylic resin (e.g., PMMA, polyacrylic acid, etc.), or an arbitrary combination thereof. In some embodiments, the first organic encapsulation layer 420 may include an acryl-based material having low permittivity and may be formed through a photomask process.

In some embodiments, the first inorganic encapsulation layer 410 may include a different material and may have a different structure than the second inorganic encapsulation layer 430 and the third inorganic encapsulation layer 450. The first inorganic encapsulation layer 410 may have a structure in which sub-layers are stacked. The first inorganic encapsulation layer 410 may include the structure described above with reference to FIGS. 6A and 6B. A thickness of the first inorganic encapsulation layer 410 may be different from a thickness of the second inorganic encapsulation layer 430 and/or a thickness of the third inorganic encapsulation layer 450.

Because the thin-film encapsulation layer 400 further includes the second organic encapsulation layer 440 and the third inorganic encapsulation layer 450, a sealing characteristic of the display apparatus may be improved.

In the display apparatus according to the illustrated embodiment, the first light-shielding layer BM1 may be arranged in the thin-film encapsulation layer 400, for example, between the first inorganic encapsulation layer 410 and the first organic encapsulation layer 420, and the second light-shielding layer BM2 may be disposed on the thin-film encapsulation layer 400, for example, on the third inorganic encapsulation layer 450. Accordingly, the strength and the impression of reflective colors of the display apparatus may be simultaneously improved.

Figure 10:
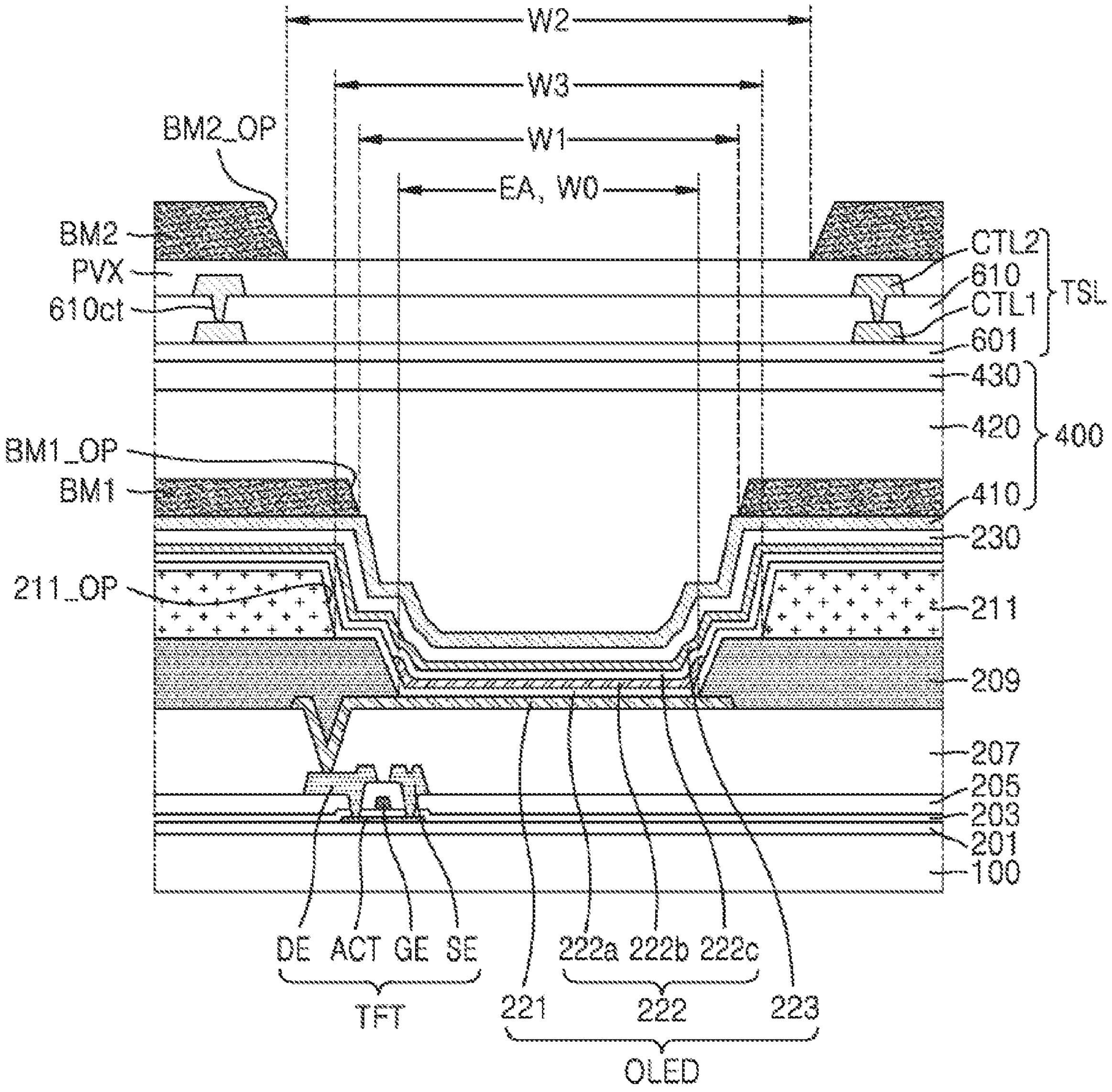
FIG. 10 is a schematic cross-sectional view of a display apparatus according to an embodiment.

FIG. 10 is a schematic cross-sectional view of a display apparatus according to an embodiment. Like reference numerals in FIGS. 7 and 10 denote like elements.

Referring to FIG. 10, a display apparatus according to an embodiment includes an organic light-emitting diode OLED disposed over the substrate 100 as a display element including an emission area EA, a thin-film encapsulation layer 400, a first light-shielding layer BM1 arranged in the thin-film encapsulation layer 400, and a second light-shielding layer BM2 disposed on the thin-film encapsulation layer 400. In an embodiment, the display apparatus may further include a capping layer 230 disposed between the organic light-emitting diode OLED and the thin-film encapsulation layer 400.

In the illustrated embodiment, a touch sensing layer TSL may be arranged between the thin-film encapsulation layer 400 and the second light-shielding layer BM2. The touch sensing layer TSL may be a layer for sensing a touch input of a user and may sense a touch input of a user by using at least one of various touch methods, such as a resistive method and a capacitive method.

The touch sensing layer TSL is disposed on the thin-film encapsulation layer 400. The touch sensing layer TSL may include a first sub-conductive layer CTL1, a second sub-conductive layer CTL2, and a touch insulating layer 610. The touch sensing layer TSL may further include a touch buffer layer 601.

The touch buffer layer 601 may be directly formed on the thin-film encapsulation layer 400. The touch buffer layer 601 may prevent damage to the thin-film encapsulation layer 400 and may block an interference signal that may be generated while the touch sensing layer TSL is driven. The touch buffer layer 601 may include an inorganic insulating material, such as $SiO_x$, $SiN_x$, or $SiO_xN_y$, or an organic material and may be a one layer or multiple layers.

The first sub-conductive layer CTL1, the touch insulating layer 610, and the second sub-conductive layer CTL2 may be sequentially stacked on the touch buffer layer 601. The first sub-conductive layer CTL1 and the second sub-conductive layer CTL2 may be disposed under and on the touch insulating layer 610, respectively. In some embodiments, the second sub-conductive layer CTL2 may act as a sensor for detecting contacts, and the first sub-conductive layer CTL1 may act as a connector for connecting, in a direction, the patterned second sub-conductive layer CTL2. In other embodiments, the first sub-conductive layer CTL1 may act as a sensor for detecting contacts, and the second sub-conductive layer CTL2 may act as a connector for connecting, in a direction, the patterned first sub-conductive layer CTL1.

In some embodiments, both the first sub-conductive layer CTL1 and the second sub-conductive layer CTL2 may act as sensors. In such an embodiment, the first sub-conductive layer CTL1 and the second sub-conductive layer CTL2 may contact each other through a contact hole (e.g., a contact opening) 610*ct* formed in the touch insulating layer 610. As described, when both the first sub-conductive layer CTL1 and the second sub-conductive layer CTL2 act as sensors, a resistance in a touch electrode may decrease, and thus, a response speed of the touch sensing layer TSL may increase.

In some embodiments, the first sub-conductive layer CTL1 and the second sub-conductive layer CTL2 may each have a mesh structure that allows light from the organic light-emitting diode OLED to pass therethrough. Accordingly, the first sub-conductive layer CTL1 and the second sub-conductive layer CTL2 may be arranged to not overlap (e.g., to be offset from) the emission area of the organic light-emitting diode OLED.

The first sub-conductive layer CTL1 and the second sub-conductive layer CTL2 may each include a metal layer or a transparent conductive layer, and the metal layer may include Mo, Ag, Ti, Cu, Al, and an alloy thereof. The transparent conductive layer may include transparent conductive oxide, such as ITO, IZO, ZnO, or ITZO. The transparent conductive layer may include a conductive polymer, such as PEDOT, metal nanowire, a carbon nanotube, graphene, or the like. In an embodiment, the first sub-conductive layer CTL1 and the second sub-conductive layer CTL2 may each have a three-layer structure including a Ti layer, an Al layer, and a Ti layer.

The touch insulating layer 610 may include an inorganic material or an organic material. The inorganic material may be at least any one of $SiN_x$, aluminum nitride (AlN), zirconium nitride (ZrN), titanium nitride (TiN), hafnium nitride (HfN), tantalum nitride (TaN), $SiO_2$, $Al_2O_3$, $TiO_2$, tin oxide ($SnO_2$), cerium oxide ($CeO_2$), and $SiO_xN_y$. The organic material may be at least any one of acrylic resin, methacrylic resin, polyisoprene, vinyl-based resin, epoxy-based resin, urethane-based resin, cellulose-based resin, and perylene-based resin.

A protective layer PVX may be disposed on the touch insulating layer 610 to cover the second sub-conductive layer CTL2. The protective layer PVX may protect the touch sensing layer TSL. The protective layer PVX may include an inorganic material or an organic material. The inorganic material may be at least any one of $SiN_x$, AlN, ZrN, TiN, HfN, TaN, $SiO_2$, $Al_2O_3$, $TiO_2$, $SnO_2$, $CeO_2$, and $SiO_xN_y$. The organic material may be at least any one of acrylic resin, methacrylic resin, polyisoprene, vinyl-based resin, epoxy-based resin, urethane-based resin, cellulose-based resin, and perylene-based resin. The protective layer PVX may be omitted in some embodiments.

The second light-shielding layer BM2 may be disposed on the touch sensing layer TSL and may reduce the external light reflected by a conductive layer, the first sub-conductive layer CTL1, and the second sub-conductive layer CTL2, which are included in the touch sensing layer TSL. The second light-shielding layer BM2 may have the second opening BM2_OP corresponding to the emission area EA of the display element, and a color filter or a reflection control layer may be arranged in the second opening BM2_OP.

In the illustrated embodiment, the touch sensing layer TSL is illustrated as being arranged between the thin-film encapsulation layer 400 and the second light-shielding layer BM2, but one or more embodiments are not limited thereto. Various modifications may be made to the touch sensing layer TSL; for example, the touch sensing layer TSL may be formed as a separate touch film and attached to an upper portion of the second light-shielding layer BM2.

In the display apparatus according to the illustrated embodiment, the first light-shielding layer BM1 may be arranged in the thin-film encapsulation layer 400, for example, between the first inorganic encapsulation layer 410 and the first organic encapsulation layer 420, and the second light-shielding layer BM2 may be disposed on the thin-film encapsulation layer 400, for example, on the third inorganic encapsulation layer 450 (e.g., on the protective layer PVX). Accordingly, the strength and the impression of reflective colors of the display apparatus may be simultaneously improved.

According to the one or more embodiments, a display apparatus includes a first light-shielding layer arranged in a thin-film encapsulation layer, and thus, the strength and the impression of reflective colors of the display apparatus may be simultaneously improved.

It should be understood that embodiments described herein should be considered in a descriptive sense and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope of the present disclosure as defined by the following claims and their equivalents.

What is claimed is:

1. A display apparatus comprising:

a substrate;

a display element on a surface of the substrate facing in a first direction;

a thin-film encapsulation layer above the display element in the first direction and comprising a first inorganic encapsulation layer, a first organic encapsulation layer, and a second inorganic encapsulation layer;

a first light-shielding layer between the first inorganic encapsulation layer and the first organic encapsulation layer and having a first opening corresponding to an emission area of the display element; and a second light-shielding layer over the thin-film encapsulation layer and having a second opening corresponding to the emission area of the display element, wherein the first organic encapsulation layer is the nearest organic layer on the display element.

2. The display apparatus of claim 1, wherein the first inorganic encapsulation layer comprises a first sub-layer comprising silicon nitride and a second sub-layer comprising silicon oxycarbide.

3. The display apparatus of claim 1, wherein a size of the first opening is less than a size of the second opening.

4. The display apparatus of claim 1, further comprising a pixel-defining layer between the substrate and the thin-film encapsulation layer and having an opening defining the emission area of the display element, wherein a size of the opening in the pixel-defining layer is less than a size of the first opening.

5. The display apparatus of claim 4, further comprising a spacer between the pixel-defining layer and the thin-film encapsulation layer and having a third opening overlapping the opening in the pixel-defining layer.

6. The display apparatus of claim 5, wherein the pixel-defining layer comprises a light-shielding material.

7. The display apparatus of claim 5, wherein the third opening is larger than the first opening and smaller than the second opening.

8. The display apparatus of claim 1, wherein the thin-film encapsulation layer further comprises:

a second organic encapsulation layer on the second inorganic encapsulation layer; and a third inorganic encapsulation layer.

9. The display apparatus of claim 1, further comprising a touch sensing layer between the thin-film encapsulation layer and the second light-shielding layer.

10. The display apparatus of claim 1, further comprising a color filter in the second opening in the second light-shielding layer.

11. The display apparatus of claim 1, further comprising a reflection control layer in the second opening in the second light-shielding layer, wherein the reflection control layer is configured to absorb light in a first wavelength range from 480 nm to 505 nm and light in a second wavelength range from 585 nm to 605 nm.

12. A display apparatus comprising:

a substrate;

a display element on a surface of the substrate facing in a first direction;

a pixel-defining layer having an opening defining an emission area of the display element;

a thin-film encapsulation layer above the display element in the first direction and comprising a first inorganic encapsulation layer, a first organic encapsulation layer, and a second inorganic encapsulation layer;

a first light-shielding layer between the first inorganic encapsulation layer and the first organic encapsulation layer and having a first opening corresponding to an emission area of the display element; and a second light-shielding layer over the thin-film encapsulation layer and having a second opening corresponding to the emission area of the display element, wherein the first inorganic encapsulation layer comprises a plurality of stacked sub-layers, and wherein the first organic encapsulation layer is the nearest organic layer on the display element.

13. The display apparatus of claim 12, wherein a size of the first opening is greater than a size of the opening in the pixel-defining layer and less than a size of the second opening.

14. The display apparatus of claim 12, wherein the first inorganic encapsulation layer comprises a first sub-layer and a second sub-layer that are stacked on each other, wherein the first sub-layer and the second sub-layer comprise different materials from each other, and wherein the first inorganic encapsulation layer has between one dyad and ten dyads.

15. The display apparatus of claim 14, wherein the first sub-layer comprises silicon nitride, and the second sub-layer comprises silicon oxycarbide.

16. The display apparatus of claim 12, further comprising a spacer between the pixel-defining layer and the thin-film encapsulation layer and having a third opening overlapping the opening in the pixel-defining layer, wherein the pixel-defining layer comprises a light-shielding material.

17. The display apparatus of claim 16, wherein the third opening is larger than the first opening and smaller than the second opening.

18. The display apparatus of claim 12, wherein the thin-film encapsulation layer further comprises:

a second organic encapsulation layer on the second inorganic encapsulation layer; and a third inorganic encapsulation layer, and wherein the first inorganic encapsulation layer comprises different materials from the second inorganic encapsulation layer and the third inorganic encapsulation layer.

19. The display apparatus of claim 12, further comprising a touch sensing layer between the thin-film encapsulation layer and the second light-shielding layer.

20. The display apparatus of claim 12, further comprising a color filter in the second opening in the second light-shielding layer.

* * * * *